United States Patent [19]
Mochizuki et al.

[11] Patent Number: 5,483,497
[45] Date of Patent: Jan. 9, 1996

[54] SEMICONDUCTOR MEMORY HAVING A PLURALITY OF BANKS USABLE IN A PLURALITY OF BANK CONFIGURATIONS

[75] Inventors: Hirohiko Mochizuki; Yoshihiro Takemae; Yukinori Kodama; Makoto Yanagisawa; Katsumi Shigenobu, all of Kawasaki, Japan

[73] Assignee: Fujitsu Limited, Kawasaki, Japan

[21] Appl. No.: 277,486

[22] Filed: Jul. 19, 1994

[30] Foreign Application Priority Data

Aug. 24, 1993 [JP] Japan ................................. 5-208117

[51] Int. Cl.[6] ............................................. G11C 7/00
[52] U.S. Cl. ........................ 365/230.03; 365/230.06; 365/233
[58] Field of Search ................... 365/230.03, 230.06, 365/230.08, 193, 233

[56] References Cited

U.S. PATENT DOCUMENTS

| | | | |
|---|---|---|---|
| 4,987,537 | 1/1991 | Kawata . | |
| 5,043,947 | 8/1991 | Oshima et al. | 365/230.03 |
| 5,251,174 | 10/1993 | Hwang | 365/230.08 |
| 5,355,344 | 10/1994 | McClure | 365/225.7 |

FOREIGN PATENT DOCUMENTS 173884   3/1986   European Pat. Off. .

OTHER PUBLICATIONS

K. Cheung et al., "Design and Analysis of a Gracefully Degrading Interleaved Memory System", *IEEE Transactions on Computers*, vol. 39, pp. 63–71 (1990).

*Primary Examiner*—David C. Nelms
*Assistant Examiner*—Vu A. Le
*Attorney, Agent, or Firm*—Armstrong, Westerman, Hattori, McLeland & Naughton

[57] ABSTRACT

A semiconductor memory having a plurality of banks, a first specify unit, and a second specify unit. The first specify unit is used to specify one of the banks by decoding a bank address signal contained in a row address signal. The second specify unit is used to specify one of the banks by decoding the bank address signal contained in the row address signal, according to bank status signals that indicate whether or not each of the banks is activated. Therefore, the semiconductor memory is used for different bank configurations. Namely, with this arrangement, the semiconductor memory is capable of serving as a memory having a smaller number of banks, to thereby improve convenience.

16 Claims, 10 Drawing Sheets

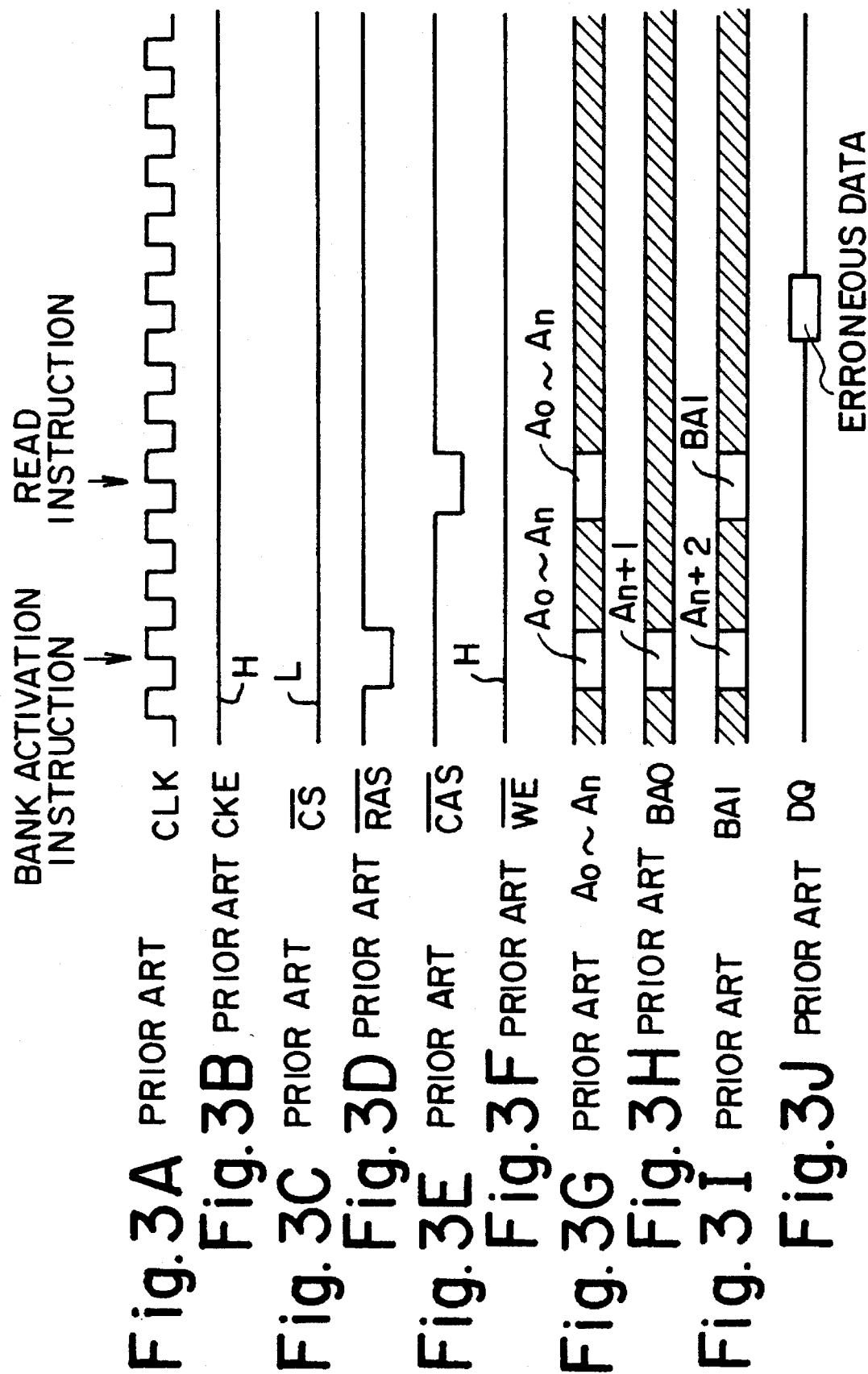

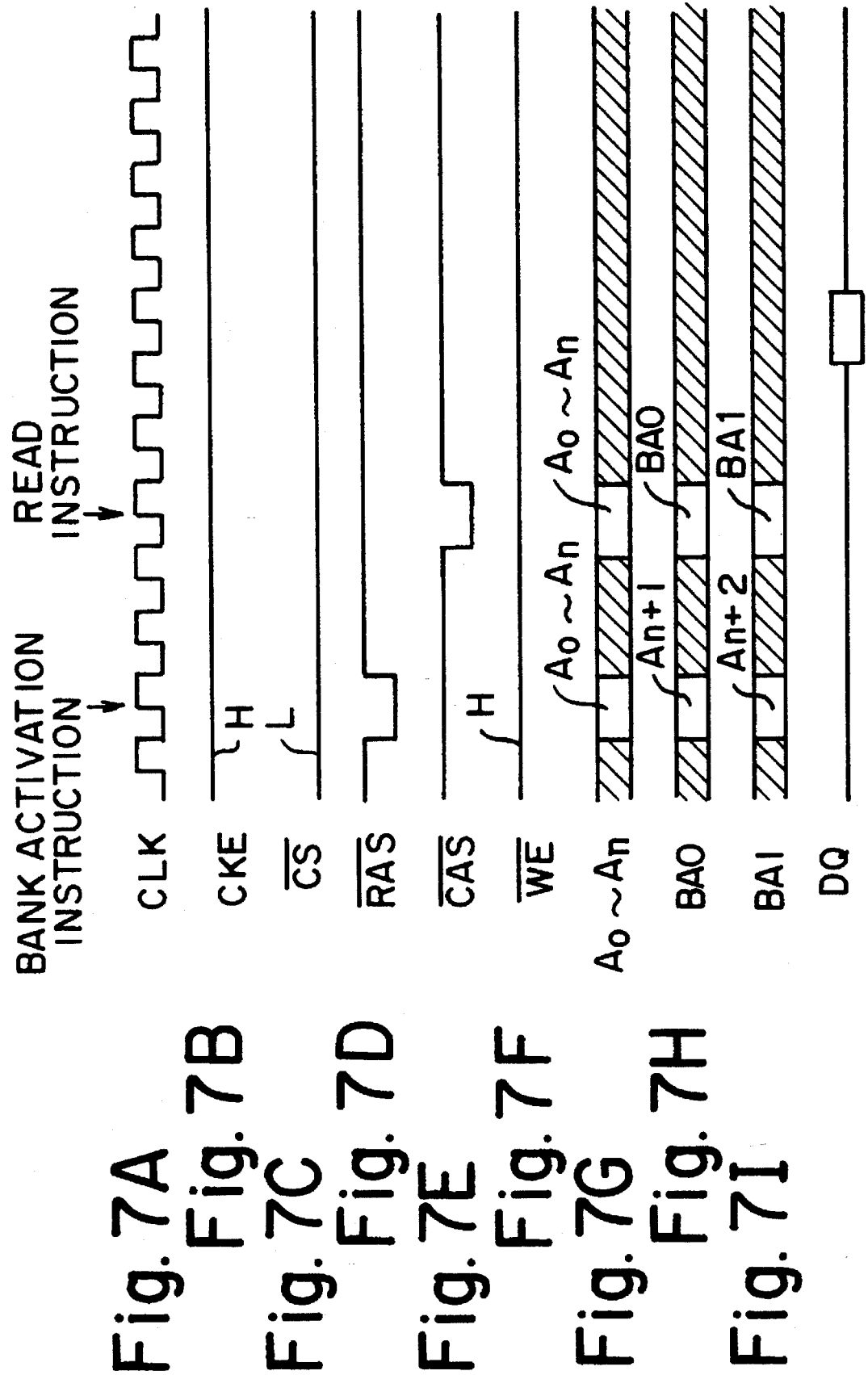

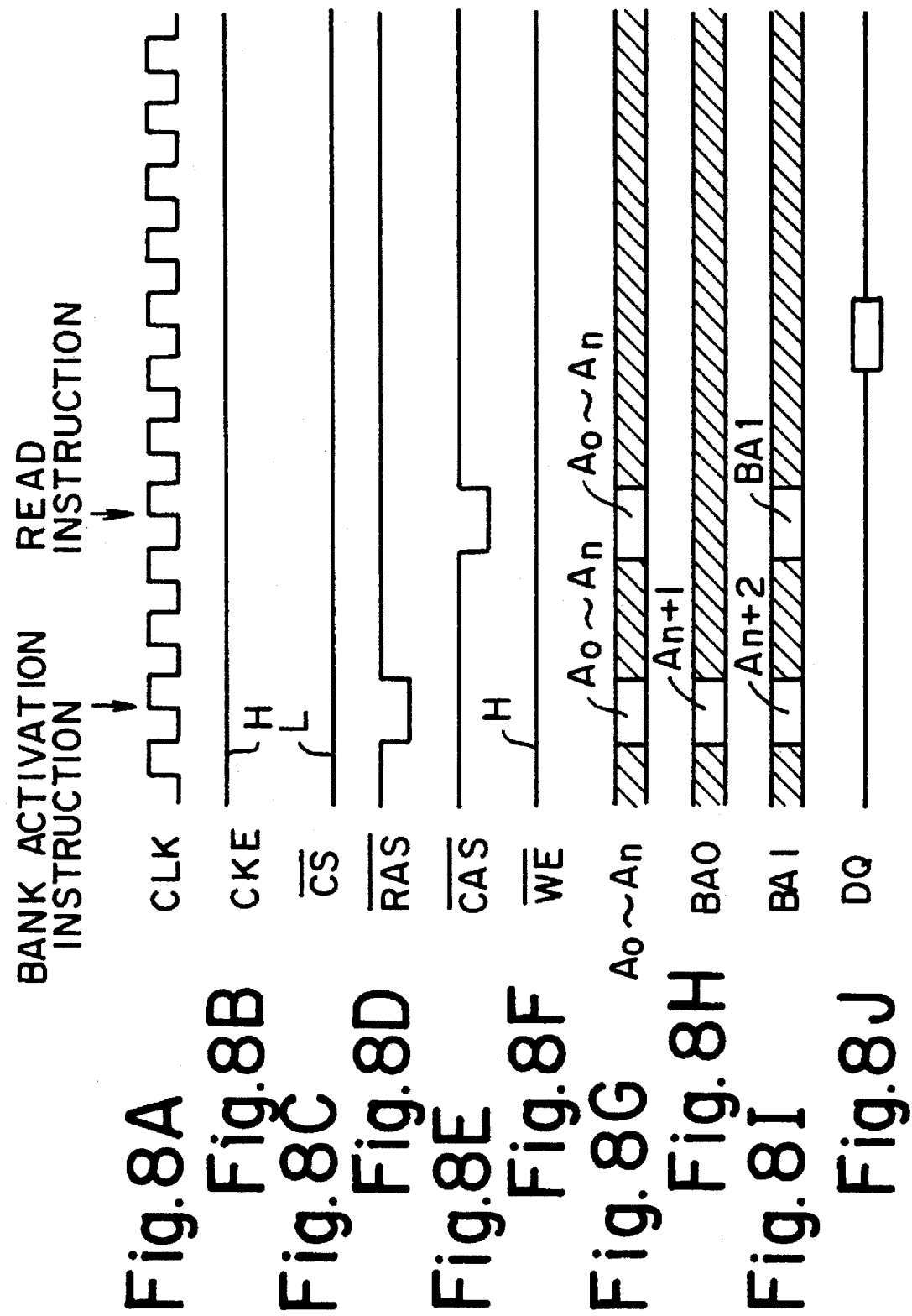

SEMICONDUCTOR MEMORY HAVING A PLURALITY OF BANKS USABLE IN A PLURALITY OF BANK CONFIGURATIONS

BACKGROUND OF THE INVENTION

1. Field of the Invention

The present invention relates to a semiconductor memory, and more particularly, to a semiconductor memory having a plurality of memory cell areas called banks.

2. Description of the Related Art

Recently, a synchronous dynamic random access memory (SDRAM) has been provided and used for a computer system, and the like. Further, a SDRAM having a plurality of banks (for example, two banks, four banks, or eight banks) has been studied and also provided. Note that the banks are maintained in an active state if required even under an unselected state.

For example, in the SDRAM having two banks, when one bank carries out an active operation, the other bank simultaneously carries out a precharge operation, so that the total operation speed becomes high. Further, for example, the SDRAM having a plurality of banks is used for a cache memory of a computer system, so as to accelerate the cache operation thereof.

Note that, among computer systems, some are designed to use four-bank SDRAMs and some are designed to use two-bank SDRAMs. In these four-bank and two-bank SDRAMs used as the cache memory of the computer system, the configuration of the SDRAM, i.e., the number of the banks, is determined in accordance with the requirement of the computer system, or the configuration of the computer system using the SDRAM.

Nevertheless, in the prior art SDRAM having a plurality of banks, for example, the four-bank SDRAM of the prior art is incompatible with the two-bank SDRAM, so that it is not applicable to the computer systems that operate with two-bank SDRAMs. This problem of the prior art SDRAM will be explained in detail with reference to the accompanying drawing.

SUMMARY OF THE INVENTION

An object of the present invention is to provide a semiconductor memory having a plurality of banks and serving as a memory having a smaller number of banks.

According to the present invention, there is provided a semiconductor memory comprising a plurality of banks, each of the banks having a plurality of memory cells, and a specific memory cell of a specific bank being selected in accordance with a first address signal and a second address signal successively provided to the semiconductor memory; a first specify unit for specifying one of the plurality of banks by decoding a bank address signal contained in the first address signal; and a second specify unit for specifying one of the plurality of banks by decoding the bank address signal contained in the first address signal, according to bank status signals that indicate whether or not each of the banks is activated, so that the semiconductor memory is used for different bank configurations.

The semiconductor memory may be a dynamic random access memory, or a synchronous dynamic random access memory. In this synchronous dynamic random access memory, a bank activation instruction and a read instruction may be provided with a clock enable signal, a chip select signal, a row address strobe signal, a column address strobe signal, and a write enable signal.

The semiconductor memory may further comprise a plurality of drivers for driving corresponding word decoders and sense amplifiers, and the bank status signals may be output from the drivers. The banks may maintain an active state if required even under an unselected state after a read operation or a write operation. The first address signal may be a row address signal, and the second address signal may be a column address signal.

The number of the banks may be determined to $2^x$, where x is an integer equal to or greater than two; the bank configurations may include a first bank configuration and a second bank configuration, the first bank configuration being $2^x$ and the second bank configuration is $2^y$, where y being an integer equal to or greater than one and obtained by dividing the x by a multiple of two. The first specify unit may decode an x-bit bank address signal contained in the first address signal, to specify one of the $2^x$ banks functioning as they are or as $2^y$ banks; and the second specify unit may decode, according to information signals indicating whether or not each of the $2^x$ banks is active, an x-bit bank address signal contained in the second address signal if the $2^x$ banks function as they are or a y-bit bank address signal contained in the second address signal if the $2^x$ banks function as $2^y$ banks, to specify the bank that has been specified according to the first address signal, so that data are written into or read out of the specified bank.

Further, according to the present invention, there is also provided a semiconductor memory having $2^x$ banks, where x is an integer equal to or greater than two, that maintain an active state if required even under an unselected state after a read or write operation, any memory cell in any one of the banks being selectable according to a first address signal and a second address signal successively provided to the semiconductor memory, wherein the semiconductor memory comprises a first specify unit for decoding an x-bit bank address signal contained in the first address signal, to specify one of the $2^x$ banks functioning as they are or as $2^y$ banks, where y is an integer equal to or greater than one and obtained by dividing the x by a multiple of two, so that a word line is selected in the specified bank; and a second specify unit for decoding, according to information signals indicating whether or not each of the $2^x$ banks is active, an x-bit bank address signal contained in the second address signal if the $2^x$ banks function as they are or a y-bit bank address signal contained in the second address signal if the $2^x$ banks function as $2^y$ banks, to specify the bank that has been specified according to the first address signal, so that data are written into or read out of the specified bank.

BRIEF DESCRIPTION OF THE DRAWINGS

The present invention will be more clearly understood from the description of the preferred embodiments as set forth below with reference to the accompanying drawings, wherein:

FIG. 2 is a timechart showing a read operation of the semiconductor memory shown in FIGS. 1A and 1B;

FIG. 3 is a timechart for explaining the problems caused in the semiconductor memory shown in FIGS. 1A and 1B;

FIG. 7 is a timechart showing a read operation of the semiconductor memory shown in FIGS. 5A and 5B, when the semiconductor memory is used as a four-bank memory; and FIG. 8 is a timechart showing a read operation of the semiconductor memory shown in FIGS. 5A and 5B, when the semiconductor memory is used as a two-bank memory.

DESCRIPTION OF THE PREFERRED EMBODIMENTS

For a better understanding of the preferred embodiments, the problems of the prior art will be explained, with reference to FIGS. 1A to 3.

Figure 1A:
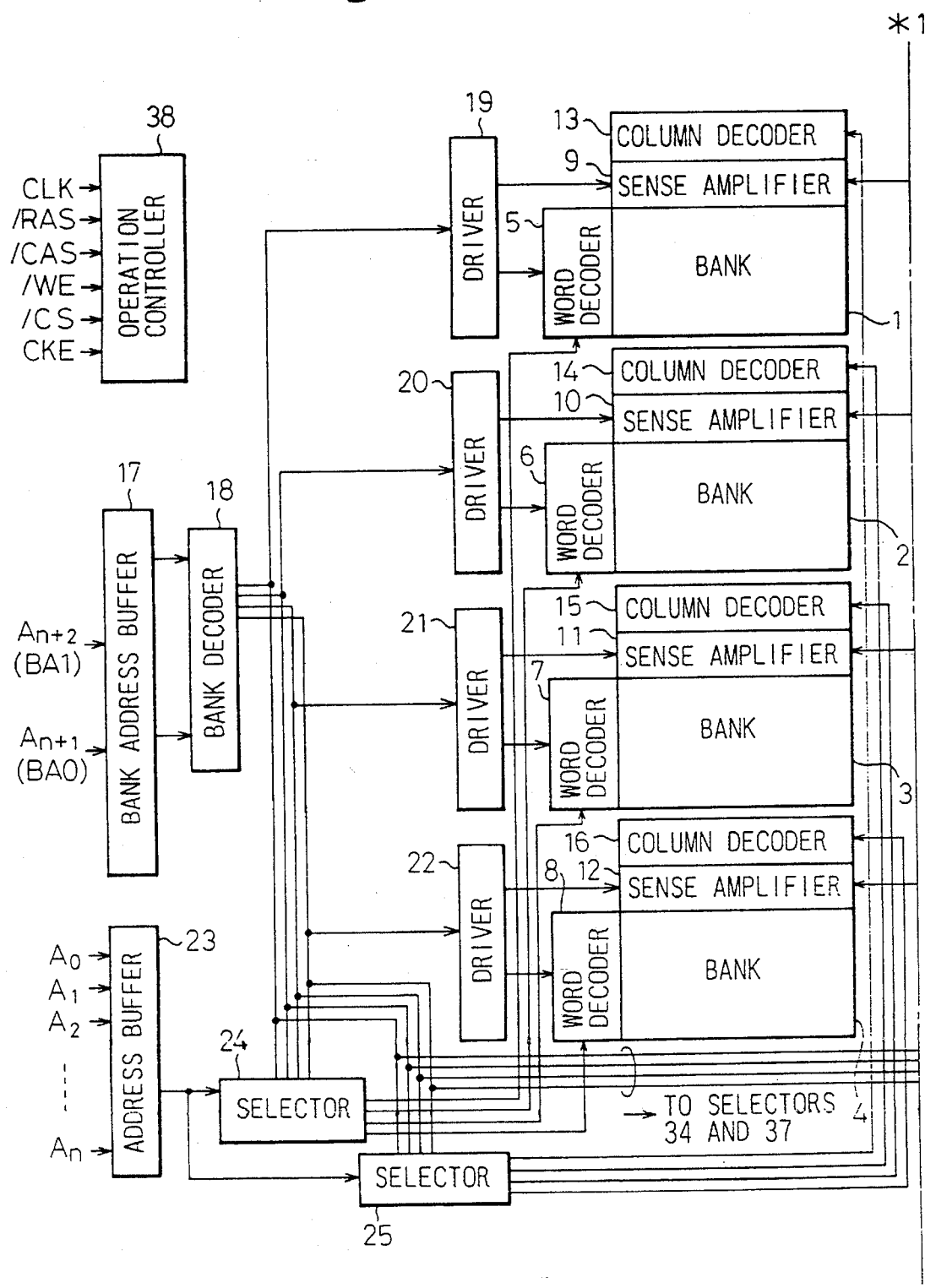
FIGS. 1A and 1B are block diagrams showing essential parts of a semiconductor memory according to the prior art.
Figure 1B:
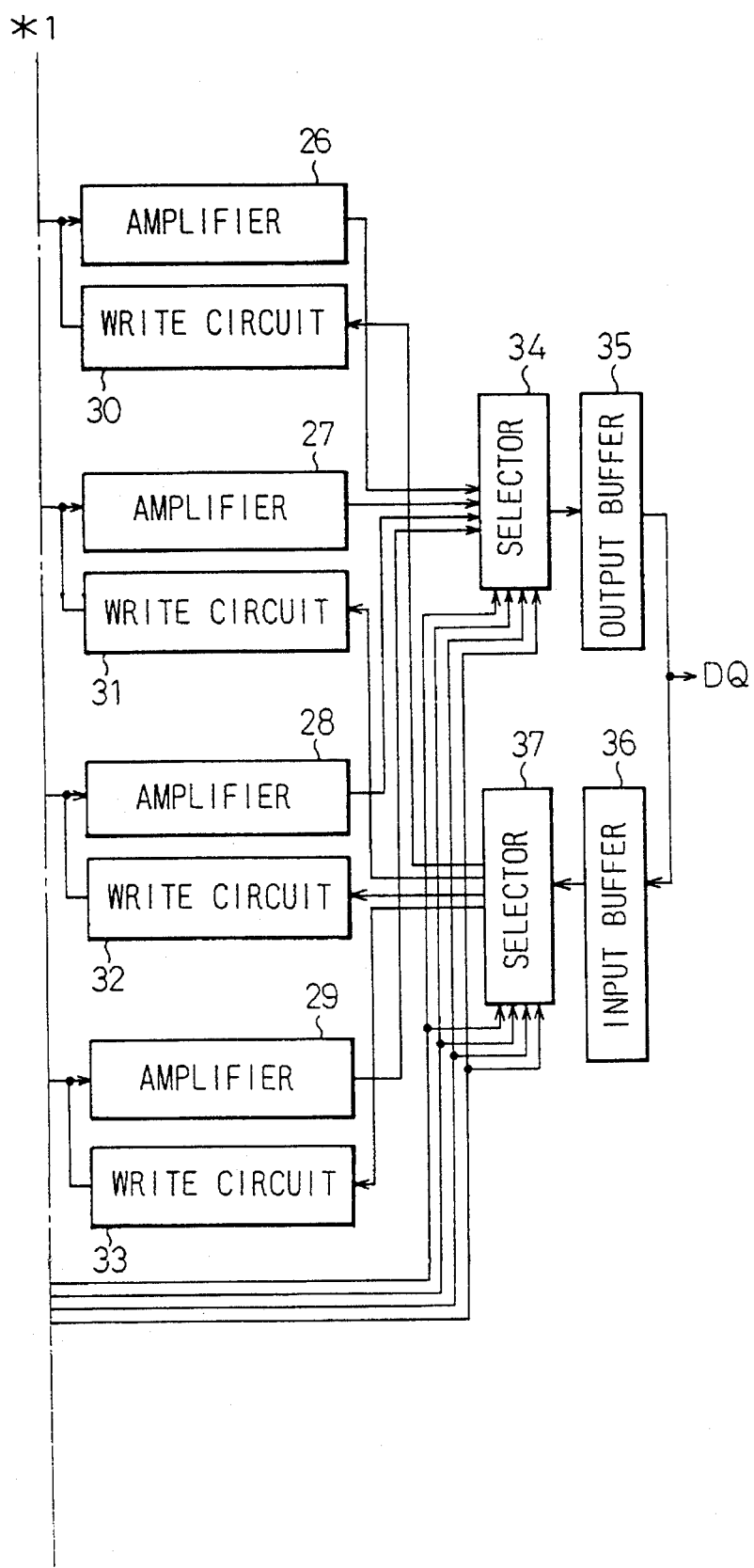

FIGS. 1A and 1B show essential parts of a semiconductor memory (SDRAM: synchronous dynamic random access memory) according to the prior art. Note that this semiconductor memory is a four-bank SDRAM employing four banks to operate in synchronism with external clock signals.

In FIGS. 1A and 1B, reference numerals 1 to 4 denote memory cell areas, i.e., banks that maintain an active state if required even under an unselected state after a write or read operation, and 5 to 8 denote word decoders provided for corresponding banks, respectively, to decode an address signal to specify a word line in the banks.

In FIGS. 1A and 1B, reference numerals 9 to 12 denotes sense amplifiers, 13 to 16 denotes column decoders, 17 denotes a bank address buffer, 18 denotes a bank decoder, and 19 to 22 denotes drivers. Further, reference numeral 23 denotes an address buffer, 24 denotes a selector, and 25 denotes a selector.

The column decoders 13 to 16 are used to decode a column address signal for specifying a column in the banks 1 to 4, and the sense amplifiers 9 to 12 are used to amplify data read out from the banks 1 to 4. The bank address buffer 17 is used to receive a bank address signal of bits BA0 and BA1 for selecting one of the banks 1 to 4, and the bank decoder 18 is used to decode the bank address signal.

One of the drivers 19 to 22 is activated to drive the word decoder and sense amplifier of a selected bank, according to the decoded signal provided by the bank decoder 18. The address buffer 23 is used to receive an address signal of bits A0 to An, and the selector 24 is used to supply a word line selecting address signal (which is provided by the address buffer 23) to the word decoder of the bank specified by the decoded signal from the bank decoder 18.

The selector 25 is used to supply a column address signal provided by the address buffer 23 to the column decoder of the bank specified by the decoded signal from the bank decoder 18.

Further, in FIGS. 1A and 1B, reference numerals 26 to 29 denotes amplifiers, 30 to 33 denotes write circuits, 34 denotes a selector. In addition, reference numeral 35 denotes an output buffer, 36 denotes an input buffer, 37 denotes a selector, 37 denotes a selector, and 38 denotes an operation controller. Further, reference mark CLK denotes a clock signal, /RAS denotes a row address strobe signal, /CAS denotes a column address strobe signal, /WE denotes a write enable signal, /CS denotes a chip select signal, and CKE denotes a clock enable signal. Note that, the mark "/" indicates a low enable signal or a low active signal, and thus, for example, the chip select signal /CS is at a low level "L", the chip being supplied with the chip select signal /CS of "L" is selected.

The amplifiers 26 to 29 are used to amplify data read through the sense amplifiers 9 to 12, and the write circuits 30 to 33 are used to write data into the banks 1 to 4. The selector 34 is used to select one of the amplifiers 26 to 29 of the bank specified by the decoded signal from the bank decoder 18.

The output buffer 35 is used to latch data from the selector 34 and provide the same outside, and the input buffer 36 is used to store write data provided from the outside. The selector 37 is used to supply the write data from the input buffer 36 to one of the write circuits 30 to 33 of the bank specified by the decoded signal from the bank decoder 18.

The operation controller 38 is used to control the operation timing of the elements mentioned above according to external control signals, and the clock enable signal CKE is used to enable the clock signal CLK.

FIG. 2 is a timechart showing a read operation of the semiconductor memory (SDRAM) shown in FIGS. 1A and 1B. In FIG. 2, a reference mark A represents the clock signal CLK, B the clock enable signal CKE, C the chip select signal /CS, D the row address strobe signal /RAS, E the column address strobe signal/CAS, and F the write enable signal /WE. Further, a reference mark G represents an address signal of bits A0 to An, H the bit BA0 of a bank address signal, I the bit BA1 of the bank address signal, and J output data DQ.

The SDRAM latches the externally supplied signals in response to a rise of the clock signal CLK. In a read operation, the SDRAM first receives a bank activation instruction and row address signal. The bank activation instruction is provided with the clock enable signal CKE of a high level "H", chip select signal /CS of a low level "L", row address strobe signal /RAS of the low level "L", column address strobe signal /CAS of the high level "H", and write enable signal /WE of the high level "H".

The row address signal involves bits A0 to An+2. The bits An+1 and An+2 are latched as the bits BA0 and BA1 of the bank address signal by the bank address buffer 17, and the bits A0 to An are latched by the address buffer 23. The bank address signal of bits BA0 and BA1 latched by the bank address buffer 17 are changed to complementary signals, and the complementary signals are supplied to the bank decoder 18 and decoded therein. The decoded signals are supplied to the drivers 19 to 22 and selectors 24, 25, 34, and 37. At this time, the selectors 25, 34, and 37 are controlled to ignore the decoded signal.

One of the drivers 19 to 22 corresponding to the decoded signal activates the corresponding word decoder and sense amplifier, to make the corresponding bank ready to be read. The bits A0 to An of the row address signal latched by the address buffer 23 are transferred to one of the word decoders 5 to 8 corresponding to the selected bank through the selector 24, so that a word line is selected in the bank.

The SDRAM then receives a read instruction. The read instruction is provided with the clock enable signal CKE of "H", chip selector signal /CS of "L", row address strobe signal /RAS of "H", column address strobe signal /CAS of "L", and write enable signal /WE of "H".

A bank address signal of bits BA0 and BA1 is latched by the bank address buffer 17, and a column address signal of bits A0 to An is latched by the address buffer 23.

The bank address signal of bits BA0 and BA1 latched by the bank address buffer 17 becomes a complementary signal, which is decoded by the bank decoder 18. The decoded signal is supplied to the drivers 19 to 22 and selectors 24, 25, 34, and 37. At this time, the drivers 19 to 22 and selectors 24 and 37 are controlled to ignore the decoded signal.

The column address signal of bits A0 to An latched by the address buffer 23 is supplied to the column decoder (13) of the selected bank (for example, bank 1) through the selector 25, so that a column is selected in the bank (1). Then, data are read out of the selected bank (1) and are latched by the output buffer 35 through the corresponding sense amplifier (9) and amplifier (26) and the selector 34. The output buffer 35 provides the data DQ outside.

By the way, among computer systems, some are designed to use four-bank SDRAMs and some are designed to use two-bank SDRAMs. Note that these four-bank and two-bank SDRAMs may be used as a cache memory of a computer system, and the configuration of the SDRAM (for example, the number of the banks) is determined in accordance with the requirement of the computer system, or the configuration of the computer system using the SDRAM. Note that the four-bank memory shown in FIGS. 1A and 1B is not usable as a two-bank memory, and therefore, inconvenient.

FIG. 3 is a timechart for explaining the problems caused in the semiconductor memory shown in FIGS. 1A and 1B. In FIG. 3, the reference marks of the signals are the same as that shown in FIG. 2.

As shown in FIG. 3, in a read operation, the computer system designed to employ two-bank SDRAMs firstly issues a bank activation instruction and row address signal to the SDRAM.

The bank activation instruction is provided with the clock enable signal CKE of a high level "H", chip select signal /CS of a low level "L", row address strobe signal /RAS of "L", column address strobe signal /CAS of "H", and write enable signal /WE of "H". The row address signal involves bits A0 to An+2. The bits An+1 and An+2 serve as the bits BA0 and BA1 of a bank address signal, which is latched by the bank address buffer 17. The remaining bits A0 to An are latched by the address buffer 23.

The bank address signal of bits BA0 and BA1 latched by the bank address buffer 17 becomes a complementary signal, which is decoded by the bank decoder 18. The decoded signal is supplied to the drivers 19 to 22 and selectors 24, 25, 34, and 37. In this case, the selectors 25, 34, and 37 are controlled to ignore the decoded signal. One of the drivers 19 to 22 specified by the decoded signal drives the corresponding word decoder and sense amplifier, to thereby activate the corresponding bank and make the bank ready to be read.

The bits A0 to An of the row address signal latched by the address buffer 23 are transferred to one of the word decoders corresponding to the selected bank through the selector 24, so that a word line is selected in the bank.

The SDRAM then receives a read instruction. The read instruction is provided with the clock enable signal CKE of "H", chip select signal /CS of "L", row address strobe signal /RAS of "H", column address strobe signal /CAS of "L", and write enable signal /WE of "H". In this case, the address signal bit An+1 is not supplied. Instead, a bank address signal of bit BA1 and a column address signal of bits A0 to An are supplied. The bank address signal is latched by the bank address buffer 17 and is decoded by the bank decoder 18.

For example, the bank 1 is selected with a bank address signal of bits BA0 of "L" and BA1 of "L", and the bank 2 with a bank address signal of bits BA0 of "H" and BA1 of "L", the bank 3 with a bank address signal of bits BA0 of "L" and BA1 of "H", and the bank 4 with a bank address signal of bits BA0 of "H" and BA1 of "H".

If the bank 1 is activated with a bank activation instruction involving the bank address signal of bits BA0 of "L" and BA1 of "L" while the bank 2 is active, the bank 1 will be selected for a read operation only when a read instruction is provided with the bank address signal of bits BA0 of "L" and BA1 of "L" in addition to a column address signal of bits A0 to An. Further, if the bit BA1 is "L" and the bit BA0 is indefinite, for example, "H", the bank 2 will be selected instead of the bank 1. Then, erroneous data will be read.

The computer system employing the two-bank SDRAMs issues a read instruction with a column address signal of bits A0 to An and a bank selection signal of only bit BA1, so that the selector 34 is unable to correctly select a bank. This is also true in a write operation. Namely, the selector 37 is unable to select a correct bank, and the data will be written into a wrong bank.

In this way, the four-bank SDRAM of the prior art shown in FIGS. 1A and 1B is incompatible with a two-bank SDRAM, so that it is not applicable to the computer systems that operate with two-bank SDRAMs.

Below, an embodiment of a semiconductor memory according to the present invention will be explained with reference to FIGS. 4 to 8.

Figure 4:
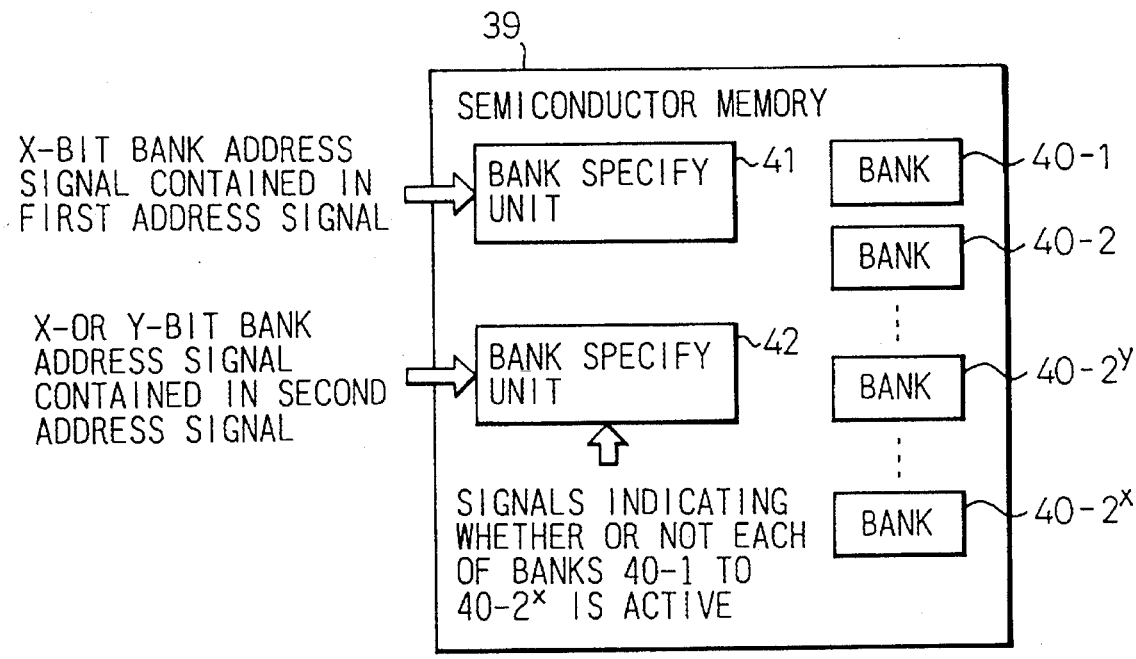
FIG. 4 is a block diagram showing a principle of a semiconductor memory according to the present invention.

FIG. 4 shows a principle of a semiconductor memory according to the present invention. This memory has a function of selecting a required memory cell in a required bank according to first and second address signals successively provided thereto.

In FIG. 4, reference numeral 39 denotes the semiconductor memory, 40-1, 40-2, 40-2$^y$, and 40-2$^x$ denote banks that maintain an active state even under an unselected state after a write or read operation, and 41 and 42 denote bank specify units for specifying a bank to be selected. Note that x is an integer equal to or greater than two, and y is an integer equal to or greater than one and is provided by dividing the x by a multiple of two.

The bank specify unit 41 decodes an x-bit bank address signal contained in the first address signal, to specify one of the $2^x$ banks functioning as they are or as $2^y$ banks, so that a word line is selected in the specified bank. The bank specify unit 42 decodes, according to information signals indicating whether or not each of the $2^x$ banks 40-1 to 40-2$^x$ is active, an x-bit bank address signal contained in the second address signal if the $2^x$ banks function as they are or a y-bit bank address signal contained in the second address signal if the $2^x$ banks function as $2^y$ banks, to specify the bank that has been specified according to the first address signal, so that data are written into or read out of the specified bank.

As described above, the present invention employs the bank specify unit 41 for specifying a bank in which a word line is selected and the bank specify unit 42 for specifying the bank that has been specified according to the first address signal, so that data are written into or read out of the specified bank.

The bank specify unit 42 decodes, according to information signals indicating whether or not each of if the $2^x$ banks 40-1 to 40-2$^x$ is active, an x-bit bank address signal contained in the second address signal if the $2^x$ banks function as they are or a y-bit bank address signal contained in the second address signal if the $2^x$ banks function as $2^y$ banks, to specify the bank that has been specified according to the first address signal, so that data are written into or read out of the specified bank. In this way, this semiconductor memory also serves as a $2^y$-bank memory so that it is applicable not only to the computer systems employing $2^x$-bank memories but also to the computer systems employing $2^y$-bank memories.

Figure 5A:
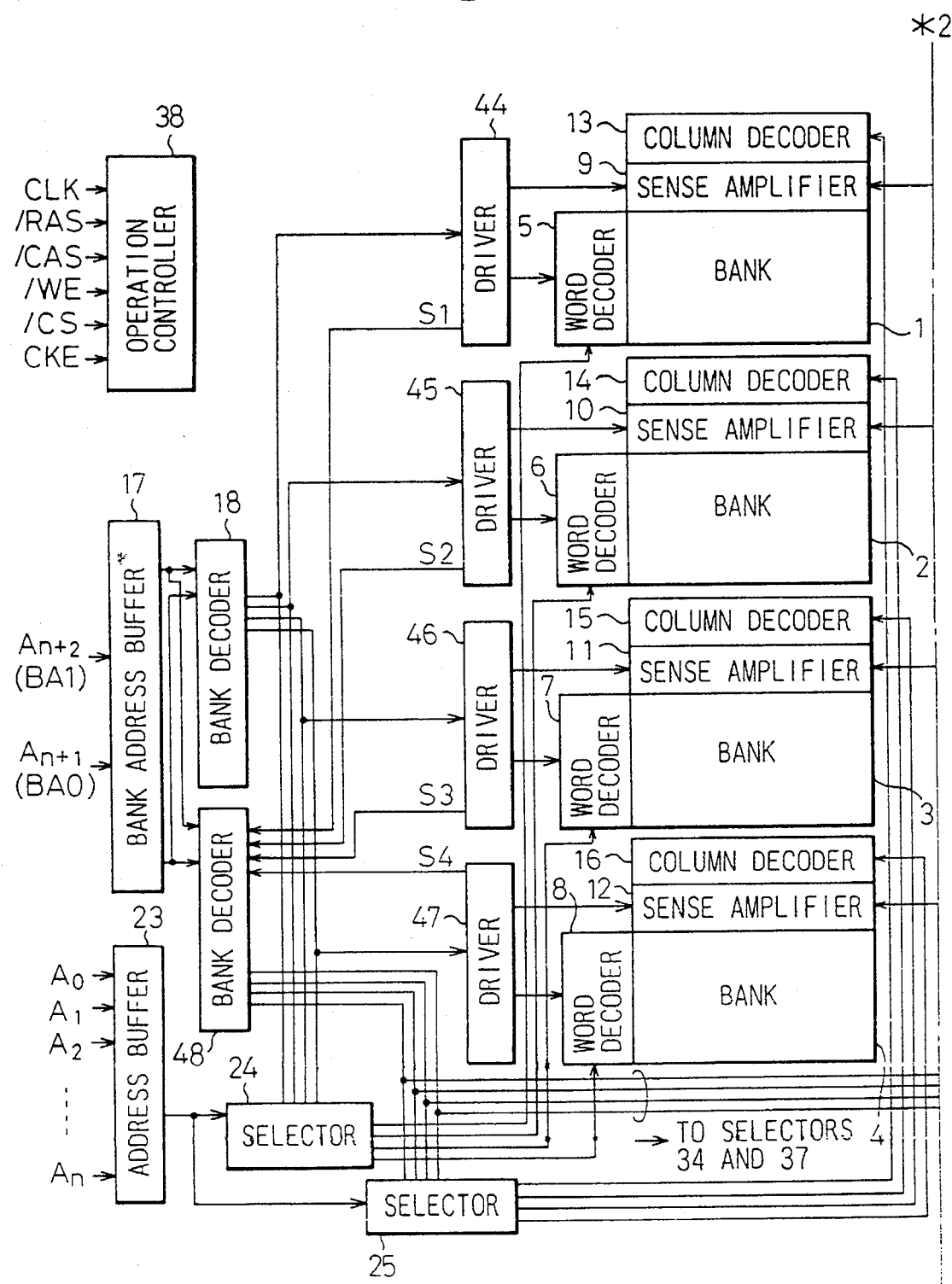
FIGS. 5A and 5B are block diagrams showing essential parts of an embodiment of a semiconductor memory according to the present invention.
Figure 5B:
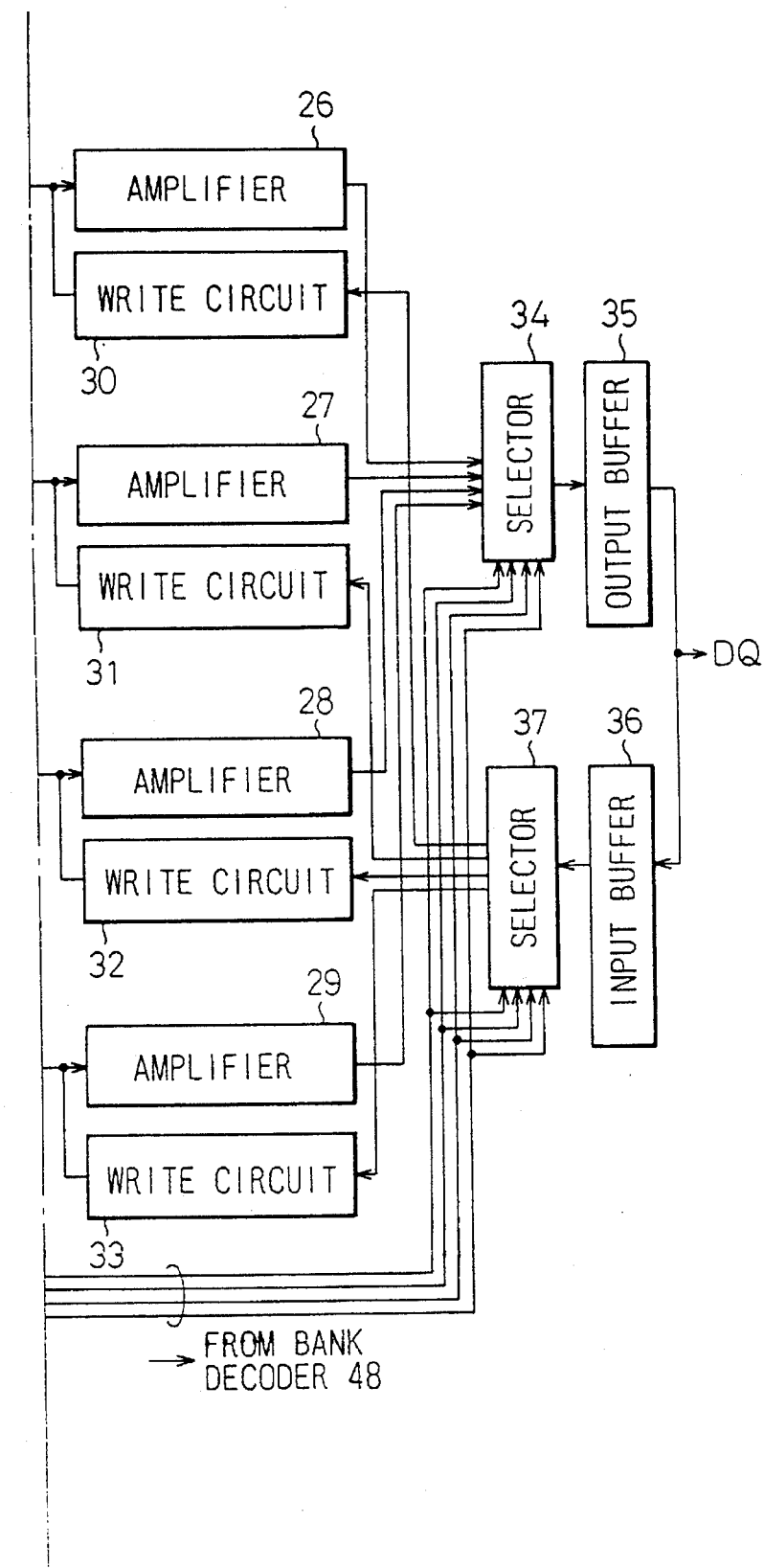

FIGS. 5A and 5B show essential parts of a four-bank SDRAM according to an embodiment of the present invention. By comparing FIGS. 5A and 5B with FIGS. 1A and 1B, this embodiment is different from the SDRAM of the prior art shown in FIGS. 1A and 1B that this embodiment of FIGS. 5A and 5B has drivers 44 to 47 for providing bank status signals S1 to S4 to indicate whether or not each bank is active, instead of the drivers 19 to 22 of the prior art.

When a word decoder 5 and sense amplifier 9 are driven to activate a bank 1, the bank status signal S1 becomes high (high level "H"), and when the word decoder 5 and sense amplifier 9 are put off to deactivate the bank 1, the bank status signal S1 becomes low (low level "L"). Similarly, when a word decoder 6 and sense amplifier 10 are driven to activate a bank 2, the bank status signal S2 becomes "H", and when the word decoder 6 and sense amplifier 10 are put off to deactivate the bank 2, the bank status signal S2 becomes "L".

Further, when a word decoder 7 and sense amplifier 11 are driven to activate a bank 3, the bank status signal S3 becomes "H", and when the word decoder 7 and sense amplifier 11 are put off to deactivate the bank 3, the bank status signal S3 becomes "L". Similarly, when a word decoder 8 and sense amplifier 12 are driven to activate a bank 4, the bank status signal S4 becomes "H", and when the word decoder 8 and sense amplifier 12 are put off to deactivate the bank 4, the bank status signal S4 becomes "L".

Next, as shown in FIG. 5A and 5B, the SDRAM of the embodiment according to the present invention has a bank decoder 48 in addition to the prior art SDRAM shown in FIGS. 1A and 1B. The bank decoder 48 of the present embodiment is used to decode a bank address provided by a bank address buffer 17 according to the bank status signals Si to S4 which are provided by the drivers 44 to 47. Further, the SDRAM of this embodiment shown in FIGS. 5A and 5B has selectors 25, 34, and 37 in addition to the prior art SDRAM shown in FIGS. 1A and 1B. The selectors 25, 34, and 37 are used to select a bank according to an output of the bank decoder 48. Note that the other arrangements of the SDRAM of this embodiment shown in FIGS. 5A and 5B are the same as those of the prior art SDRAM shown in Figs. 1A and 1B.

Figure 6:
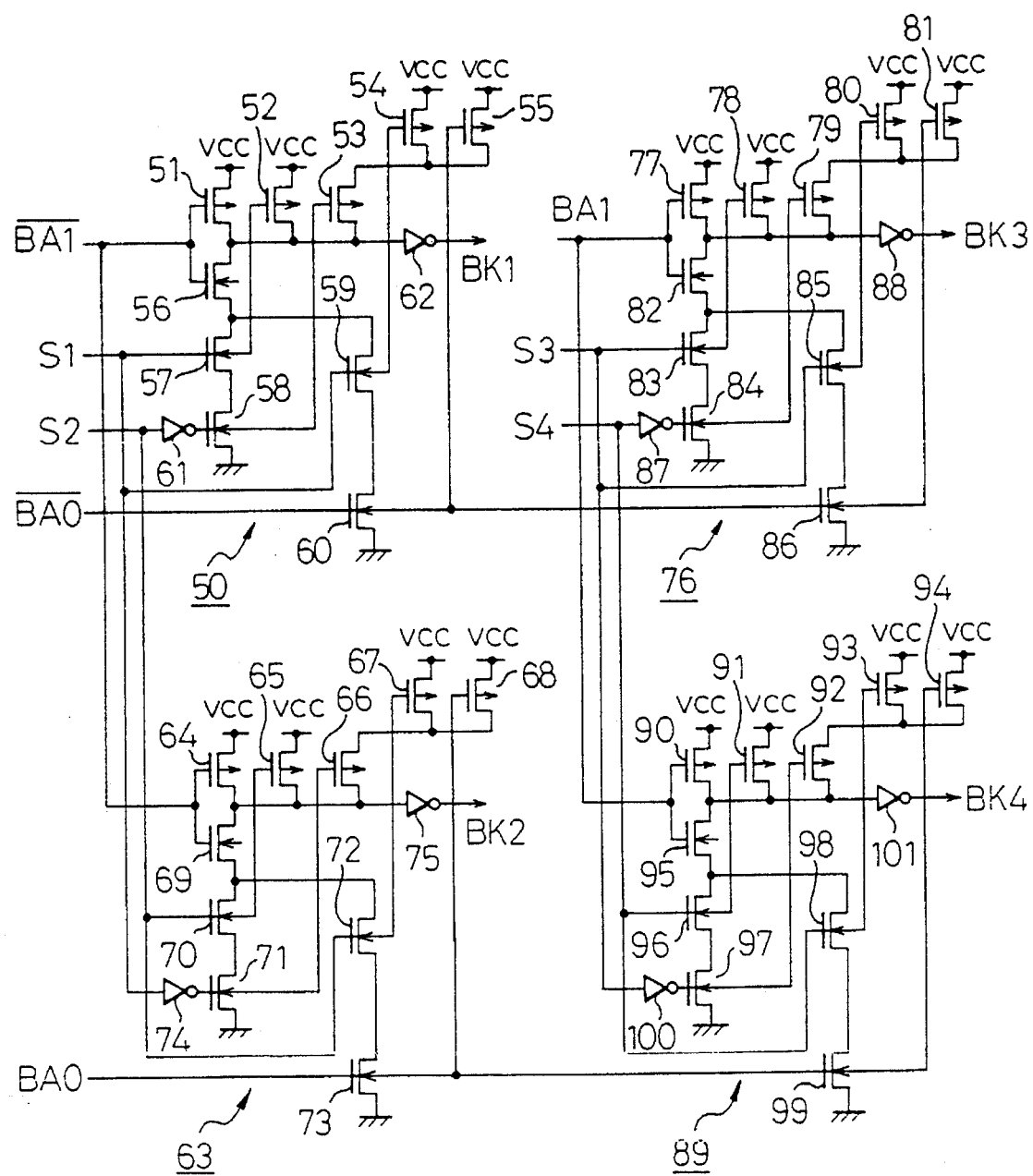
FIG. 6 is a circuit diagram showing a bank decoder of the semiconductor memory shown in FIGS. 5A and 5B.

FIG. 6 shows a bank decoder of the semiconductor memory shown in FIGS. 5A and 5B. In FIG. 6, reference marks BK1 to BK4 denote decoded signals provided by the bank decoder 48. Table 1 shows relationships between the decoded signals BK1 to BK4 and banks to be specified.

[TABLE 1]

| BK1 | BK2 | BK3 | BK4 | Selection Specified Bank |
| --- | --- | --- | --- | --- |
| H | L | L | L | BANK 1 |
| L | H | L | L | BANK 2 |
| L | L | H | L | BANK 3 |
| L | L | L | H | BANK 4 |

In FIG. 6, a reference numeral 50 denotes a section to produce the decoded signal BK1, 51 to 55 denote P-channel type MOS (pMOS) transistors, 56 to 60 denote N-channel type MOS (nMOS) transistors, and 61 and 62 denote inverters.

Further, reference numeral 63 denotes a section to produce the decoded signal BK2, 64 to 68 denote pMOS transistors, 69 to 73 denote nMOS transistors, and 74 and 75 denote inverters. In addition, reference numeral 76 denotes a section to produce the decoded signal BK3, 77 to 81 denote pMOS transistors, 82 to 86 denote nMOS transistors, 87 and 88 denote inverters, 89 denotes a section to produce the decoded signal BK4, 90 to 94 are pMOS transistors, 95 to 99 denote nMOS transistors, and 100 and 101 denote inverters.

FIG. 7 is a timechart showing a read operation of the semiconductor memory shown in FIGS. 5A and 5B, when the semiconductor memory is used as a four-bank memory.

In FIG. 7, a reference mark A represents the clock signal CLK, B the clock enable signal CKE, C the chip select signal /CS, D the row address strobe signal /RAS, E the column address strobe signal /CAS, and F the write enable signal /WE. Further, a reference mark G represents an address signal of bits A0 to An, H the bit BA0 of a bank address signal, I the bit BA1 of the bank address signal, and J output data DQ.

These externally supplied signals are latched in response to a rise of the clock signal CLK. In a read operation, a bank activation instruction and a row address signal are firstly provided. The bank activation instruction is provided with the clock enable signal CKE of high (high level "H"), chip select signal /CS of low (low level "L"), row address strobe signal /RAS of "L", column address strobe signal /CAS of "H", and write enable signal /WE of "H".

The row address signal involves bits A0 to An+2 among which the bits An+1 and An+2 are latched as the bits BA0 and BA1 of a bank address signal by the bank address buffer 17, and the bits A0 to An are latched by the address buffer 23.

The bank address signal of bits BA0 and BA1 latched by the bank address buffer 17 becomes a complementary signal, which is transferred to the bank decoders 18 and 48. In this case, the bank decoder 48 is controlled to ignore the bank address signal. The bank address signal of bits BA0 and BA1 is decoded by the bank decoder 18, and the decoded signal is supplied to the drivers 44 to 47 and selector 24.

One of the drivers 44 to 47 selected by the decoded signal drives the corresponding word decoder and sense amplifier to activate the corresponding bank, which becomes ready to provide data.

The bits A0 to An of the row address signal latched by the address buffer 23 are transferred to the word decoder of the selected bank through the selector 24, so that a word line is selected in the bank.

A read instruction is then issued. The read instruction is provided with the clock enable signal CKE of "H", chip select signal /CS of "L", row address strobe signal /RAS of "H", column address strobe signal /CAS of "L", and write enable signal /WE of "H".

A bank address signal of bits BA0 and BA1 and a column address signal of bits A0 to An are received. The bank address signal of bits BA0 and BA1 is latched by the bank address buffer 17, and the column address signal of bits A0 to An is latched by the address buffer 23.

The bank address signal of bits BA0 and BA1 latched by the bank address buffer 17 becomes a complementary signal, which is transferred to the bank decoders 18 and 48. At this time, the bank decoder 18 is controlled to ignore the bank address signal, and the bank decoder 48 decodes the bank address signal.

Tables 2 to 5 show functions of the bank decoder 48 when the embodiment serves as a four-bank memory.

[TABLE 2]

| BA0 | BA1 | S1 | S2 | S3 | S4 | BK1 | BK2 | BK3 | BK4 |
|-----|-----|----|----|----|----|-----|-----|-----|-----|
| L | L | H | L | L | L | H | L | L | L |
| L | L | H | H | L | L | H | L | L | L |
| L | L | H | L | H | L | H | L | L | L |
| L | L | H | L | L | H | H | L | L | L |
| L | L | H | H | H | L | H | L | L | L |
| L | L | H | H | L | H | H | L | L | L |
| L | L | H | L | H | H | H | L | L | L |
| L | L | H | H | H | H | H | L | L | L |

As shown in the above Table 2, if the bits An+1 (the bit BA0 of the bank address signal) and An+2 (the bit BA1 of the bank address signal) of the row address signal issued with the bank activation instruction are "L" and "L", respectively, the bank 1 is activated. Thereafter, if the bits BA0 and BA1 of the bank address signal issued with the read instruction and the column address signal of bits A0 to An are "L" and "L", respectively, not only the bank 1 but also one, two, or all of the banks 2, 3, and 4 will be active as shown in Table 2. Under this situation, the bank decoder 48 provides a decoded signal of bits BK1 of "H", BK2 of "L", BK3 of "L" and BK4 of "L", to correctly specify the bank 1 to be selected.

[TABLE 3]

| BA0 | BA1 | S1 | S2 | S3 | S4 | BK1 | BK2 | BK3 | BK4 |
|-----|-----|----|----|----|----|-----|-----|-----|-----|
| H | L | L | H | L | L | L | H | L | L |
| H | L | H | H | L | L | L | H | L | L |
| H | L | L | H | H | L | L | H | L | L |
| H | L | L | H | L | H | L | H | L | L |
| H | L | H | H | H | L | L | H | L | L |
| H | L | H | H | L | H | L | H | L | L |
| H | L | L | H | H | H | L | H | L | L |
| H | L | H | H | H | H | L | H | L | L | as shown in the above Table 3, if the bits An+1 (the bit BA0 of the bank address signal) and An+2 (the bit BA1 of the bank address signal) of the row address signal issued with the bank activation instruction are "H" and "L", respectively, the bank 2 is activated. Thereafter, if the bits BA0 and BA1 of the bank address signal issued with the read instruction and the column address signal of bits A0 to An are "H" and "L", respectively, not only the bank 2 but also one, two, or all of the banks 1, 3, and 4 will be active as shown in Table 3. Under this situation, the bank decoder 48 provides a decoded signal of bits BK1 of "L", BK2 of "H", BK3 of "L", and BK4 of "L", to correctly specify the bank 2 to be selected.

[TABLE 4]

| BA0 | BA1 | S1 | S2 | S3 | S4 | BK1 | BK2 | BK3 | BK4 |
|-----|-----|----|----|----|----|-----|-----|-----|-----|
| L | H | L | L | H | L | L | L | H | L |
| L | H | H | L | H | L | L | L | H | L |
| L | H | L | H | H | L | L | L | H | L |
| L | H | L | L | H | H | L | L | H | L |
| L | H | H | H | H | L | L | L | H | L |
| L | H | H | L | H | H | L | L | H | L |
| L | H | L | H | H | H | L | L | H | L |
| L | H | H | H | H | H | L | L | H | L |

As shown in the above Table 4, if the bits An+1 (the bit BA0 of the bank address signal) and An+2 (the bit BA1 of the bank address signal) of the row address signal issued with the bank activation instruction are "L" and "H", respectively, the bank 3 is activated. Thereafter, if the bits BA0 and BA1 of the bank address signal issued with the read instruction and the column address signal of bits A0 to An are "L" and "H", respectively, not only the bank 3 but also one, two, or all of the banks 1, 2, and 4 will be active as shown in Table 4. Under this situation, the bank decoder 48 provides a decoded signal of bits BK1 of "L", BK2 of "L", BK3 of "H", and BK4 of "L", to correctly specify the bank 3 to be selected.

[TABLE 5]

| BA0 | BA1 | S1 | S2 | S3 | S4 | BK1 | BK2 | BK3 | BK4 |
|-----|-----|----|----|----|----|-----|-----|-----|-----|
| H | H | L | L | L | H | L | L | L | H |
| H | H | H | L | L | H | L | L | L | H |
| H | H | L | H | L | H | L | L | L | H |
| H | H | L | L | H | H | L | L | L | H |
| H | H | H | H | L | H | L | L | L | H |
| H | H | H | L | H | H | L | L | L | H |
| H | H | L | H | H | H | L | L | L | H |
| H | H | H | H | H | H | L | L | L | H |

As shown in the above Table 5, if the bits An+1 (the bit BA0 of the bank address signal) and An+2 (the bit BA1 of the bank address signal) of the row address signal issued with the bank activation instruction are "H" and "H", respectively, the bank 4 is activated. Thereafter, if the bits BA0 and BA1 of the bank address signal issued with the read instruction and the column address signal of bits A0 to An are "H" and "H", respectively, not only the bank 4 but also one, two, or all of the banks 1, 2, and 3 will be active as shown in Table 5. Under this situation, the bank decoder 48 provides a decoded signal of bits BK1 of "L", BK2 of "L", BK3 of "L", and BK4 of "H", to correctly specify the bank 4 to be selected.

The column address signal of bits A0 to An latched by the address buffer 23 is supplied to the column decoder of the selected bank through the selector 25, so that a column is selected in the bank. Data read out of the selected bank are latched by the output buffer 35 through the sense amplifier and amplifier of the selected bank and the selector 34 and are provided outside. In this way, the SDRAM of this embodiment serving as the four-bank memory completes the read operation.

FIG. 8 is a timechart showing a read operation of the semiconductor memory shown in FIGS. 5A and 5B, when the semiconductor memory is used as a two-bank memory with the banks 1 and 2 serving as a bank and the banks 3 and 4 as another bank. In FIG. 8, the reference marks of the signals are the same as that shown in FIG. 7.

In the read operation, a computer system employing the two-bank SDRAM issues a bank activation instruction and row address signal.

The bank activation instruction is provided with the clock enable signal CKE of "H", chip select signal /CS of "L", row address strobe signal /RAS of "L", column address strobe signal /CAS of "H", and write enable signal /WE of "H".

The row address signal involves bits A0 to An+2. The bits An+1 and An+2 serve as bits BA0 and BA1 of a bank address signal, which are latched by the bank address buffer 17. The remaining bits A0 to An are latched by the address buffer 23.

The bank address signal of bits BA0 and BA1 latched by the bank address buffer 17 becomes a complementary signal, which is transferred to the bank decoders 18 and 48. In this case, the bank decoder 48 is controlled to ignore the bank address signal.

The bank decoder 18 decodes the bank address signal of bits BA0 and BA1 and provides the decoded signal to the drivers 44 to 47 and selector 24.

One of the drivers 44 to 47 specified by the decoded signal drives the word decoder and sense amplifier of the corresponding bank, to make the bank ready to be read.

The bits A0 to An of the row address signal latched by the address buffer 23 are transferred to the word decoder of the selected bank through the selector 24, so that a word line is selected in the bank.

A read instruction is then provided with the clock enable signal CKE of "H", chip select signal /CS of "L", row address strobe signal /RAS of "H", column address strobe signal /CAS of "L", and write enable signal /WE of "H".

This time, a bank address signal of bit BA1 and a column address signal of bits A0 to An with no bit An+1 are provided. The bank address signal bit BA1 is latched by the bank address buffer 17. The column address signal of bits A0 to An is latched by the address buffer 23.

The bank address signal BA1 latched by the bank address buffer 17 becomes a complementary signal, which is transferred to the bank decoders 18 and 48. In this case, the bank decoder 18 is controlled to ignore the bank address signal.

The bank decoder 48 decodes the bank address signal BA1 and supplies a decoded signal of bits BK1 to BK4 to the selectors 25, 34, and 37. The selector 37 is controlled to ignore the decoded signal.

Table 6 shows functions of the bank decoder 48 when the embodiment serves as a two-bank memory with the banks 1 and 2 functioning as one bank and the banks 3 and 4 as another bank. In Table 6, a mark X may take any one of "H" and "L".

[TABLE 6]

| BA0 | BA1 | S1 | S2 | S3 | S4 | BK1 | BK2 | BK3 | BK4 |
|-----|-----|----|----|----|----|-----|-----|-----|-----|
| X | L | H | L | L | L | H | L | L | L |
| X | L | H | L | H | L | H | L | L | L |
| X | L | H | H | L | H | H | L | L | L |
| X | L | L | L | L | L | L | H | L | L |
| X | L | L | H | H | L | L | H | L | L |
| X | L | L | L | L | H | L | H | L | L |
| X | H | L | H | H | L | L | L | H | L |
| X | H | H | H | L | L | L | L | H | L |
| X | H | L | H | H | L | L | L | H | L |
| X | H | L | L | L | H | L | L | L | H |
| X | H | H | H | L | H | L | L | L | H |
| X | H | L | L | L | H | L | L | L | H |

As shown in the above Table 6, if the bits An+1 (the bit BA0 of the bank address signal) and An+2 (the bit BA1 of the bank address signal) of the row address signal issued with the bank activation instruction are "L" and "L", respectively, the bank 1 is activated. Thereafter, if the bank address signal BA1 issued with the read instruction and the column address signal of bits A0 to An is "L", not only the bank 1 but also any one of the banks 3 and 4 will be active as shown in Table 6. Under this situation, the bank decoder 48 provides a decoded signal of bits BK1 of "H", BK2 of "L", BK3 of "L", and BK4 of "L", to correctly specify the bank 1 to be selected.

Further, if the bits An+1 (the bit BA0 of the bank address signal) and An+2 (the bit BA1 of the bank address signal) of the row address signal issued with the bank activation instruction are "H" and "L", respectively, the bank 2 is activated. Thereafter, if the bank address signal BA1 issued with the read instruction and the column address signal of bits A0 to An is "L", not only the bank 2 but also any one of the banks 3 and 4 will be active as shown in Table 6. Under this situation, the bank decoder 48 provides a decoded signal of bits BK1 of "L", BK2 of "H38", BK3 of "L", and BK4 of "L", to correctly specify the bank 2 to be selected.

Further, as shown in the above Table 6, if the bits An+1 (the bit BA0 of the bank address signal) and An+2 (the bit BA1 of the bank address signal) of the row address signal issued with the bank activation instruction are "L" and "H", respectively, the bank 3 is activated. Thereafter, if the bank address signal BA1 issued with the read instruction and the column address signal of bits A0 to An is "H", not only the bank 3 but also any one of the banks 1 and 2 will be active as shown in Table 6. Under this situation, the bank decoder 48 provides a decoded signal of bits BK1 of "L", BK2 of "L", BK3 of "H", and BK4 of "L", to correctly specify the bank 3 to be selected.

In addition, if the bits 1 (the bit BA0 of the bank address signal) and An+2 (the bit BA1 of the bank address signal) of the row address signal issued with the bank activation instruction are "H" and "H", respectively, the bank 4 is activated. Thereafter, if the bank address signal BA1 issued with the read instruction and the column address signal of bits A0 to An is "H", not only the bank 4 but also any one of the banks 1 and 2 will be active as shown in Table 6. Under this situation, the bank decoder 48 provides a decoded signal of bits BK1 of "L", BK2 of "L", BK3 of "L", and BK4 of "H", to correctly specify the bank 4 to be selected.

The column address signal of bits A0 to An latched by the address buffer 23 is supplied to the column decoder of the selected bank through the selector 25, so that a column is selected in the selected bank. Data read out of the selected bank are latched by the output buffer 35 through the sense amplifier and amplifier of the selected bank and the selector 34 and are provided outside. In this way, the SDRAM of this embodiment serving as the two-bank memory completes the read operation.

In a write operation, the selector 37 instead of the selector 34 works, and the SDRAM serves as any one of the four- and two-bank memories similar to the read operation.

As explained above, this embodiment employs the bank decoder 18 for decoding a bank address signal of bits BA0 and BA1 contained in a row address signal of bits A0 to An+1, to specify a bank in which a word line is selected. The embodiment also employs the bank decoder 48 for specifying the bank specified according to the bank address signal of bits BA0 and BA1 contained in the row address signal of bits A0 to An+1 so that data are read out of or written into the specified bank, according to bank status signals S1 to $3 that indicate whether or not each of the banks 1 to 4 is active. Accordingly, this embodiment serves not only as a four-bank memory but also as a two-bank memory, to secure improved convenience.

As described above, the present invention provides a semiconductor memory having a bank specify unit (41) for specifying a bank in which a word line is selected according to a bank address signal contained in a first address signal, and a bank specify unit (42) for specifying the bank selected according to the first address signal according to signals that indicate whether or not each of the banks (40-1, 40-2, . . . , 40-2$^x$) is active and a bank address signal contained in a second address signal that is provided after the first address signal, so that data are read out of or written into the specified bank. With this arrangement, the semiconductor memory of the present invention is capable of serving as a memory having a smaller number of banks, to thereby improve convenience.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory comprising:
   a plurality of banks, each of said banks having a plurality of memory cells, and a specific memory cell of a specific bank being selected in accordance with a first address signal and a second address signal successively provided to said semiconductor memory;
   a first specify means for specifying one of said plurality of banks by decoding a bank address signal contained in said first address signal; and
   a second specify means or specifying one of said plurality of banks by decoding the bank address signal contained in said first address signal, according to bank status signals indicating whether or not each of said banks is activated, so that said semiconductor memory is used for different bank configurations.

2. A semiconductor memory as claimed in claim 1, wherein said semiconductor memory is a dynamic random access memory.

3. A semiconductor memory as claimed in claim 2, wherein said dynamic random access memory is a synchronous dynamic random access memory.

4. A semiconductor memory as claimed in claim 3, wherein a bank activation instruction and a read instruction are provided with a clock enable signal, a chip select signal, a row address strobe signal, a column address strobe signal, and a write enable signal.

5. A semiconductor memory as claimed in claim 1, wherein said plurality of drivers drive corresponding word decoders and sense amplifiers.

6. A semiconductor memory as claimed in claim 1, wherein said banks maintain an active state if required even under an unselected state after a read operation or a write operation.

7. A semiconductor memory as claimed in claim 1, wherein said first address signal is a row address signal, and said second address signal is a column address signal.

8. A semiconductor memory as claimed in claim 1, wherein the number of said banks are determined to $2^x$, where x is an integer equal to or greater than two; said bank configurations include a first bank configuration and a second bank configuration, said first bank configuration being $2^x$ and said second bank configuration being $2^y$, where y is an integer equal to or greater than one and obtained by dividing the x by a multiple of two.

9. A semiconductor memory as claimed in claim 8, wherein said first specify means decodes an x-bit bank address signal contained in said first address signal, to specify one of said $2^x$ banks functioning as they are or as $2^y$ banks; and said second specify means decodes, according to said bank status signals indicating whether or not each of said $2^x$ banks is active, an x-bit bank address signal contained in said second address signal if said $2^x$ banks function as they are or a y-bit bank address signal contained in said second address signal if said $2^x$ banks function as $2^y$ banks, to specify the bank that has been specified according to said first address signal, so that data are written into or read out of said specified bank.

10. A semiconductor memory having $2^x$ banks, where x is an integer equal to or greater than two, that maintain an active state if required even under an unselected state after a read or write operation, any memory cell in any one of said banks being selectable according to a first address signal and a second address signal successively provided to said semiconductor memory, wherein said semiconductor memory comprises:
    a first specify means for decoding an x-bit bank address signal contained in said first address signal, to specify one of said $2^x$ banks functioning as they are or as $2^y$ banks, where y is an integer equal to or greater than one and obtained by dividing the x by a multiple of two, so that a word line is selected in said specified bank; and
    a second specify means for decoding, according to indicating whether or not each of said $2^x$ banks is active, an x-bit bank address signal contained in said second address signal if said $2^x$ banks function as they are or a y-bit bank address signal contained in said second address signal if said $2^x$ banks functional as $2^y$ banks, to specify the bank that has been specified according to said first address signal, so that data are written into or read out of said specified bank.

11. A semiconductor memory as claimed in claim 10, wherein said semiconductor memory is a dynamic random access memory.

12. A semiconductor memory as claimed in claim 11, wherein said dynamic random access memory is a synchronous dynamic random access memory.

13. A semiconductor memory as claimed in claim 12, wherein a bank activation instruction and a read instruction are provided with a clock enable signal, a chip select signal, a row address strobe signal, a column address strobe signal, and a write enable signal.

14. A semiconductor memory as claimed in claim 10, wherein said plurality of drivers drive corresponding word decoders and sense amplifiers.

15. A semiconductor memory as claimed in claim 10, wherein said banks maintain an active state if required even under an unselected state after a read operation or a write operation.

16. A semiconductor memory as claimed in claim 10, wherein said first address signal is a row address signal, and said second address signal is a column address signal.

* * * * *